(12) United States Patent
Mansour et al.

(10) Patent No.: US 10,389,394 B2
(45) Date of Patent: Aug. 20, 2019

(54) METHOD AND DEVICE FOR PROCESSING A SIGNAL

(71) Applicant: Robert Bosch GmbH, Stuttgart (DE)

(72) Inventors: Ahmad Mansour, Weil der Stadt (DE); Kerrin Doessel, Stuttgart (DE); Stefan Leidich, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/040,571

(22) Filed: Jul. 20, 2018

(65) Prior Publication Data

US 2019/0028130 A1    Jan. 24, 2019

(30) Foreign Application Priority Data

Jul. 20, 2017  (DE) .................... 10 2017 212 431

(51) Int. Cl.
| | |
|---|---|
| *H04B 1/10* | (2006.01) |
| *H03M 1/12* | (2006.01) |
| *G10L 15/02* | (2006.01) |
| *G10L 25/24* | (2013.01) |
| *H04W 84/18* | (2009.01) |
| *H04R 3/04* | (2006.01) |

(52) U.S. Cl.
CPC .............. *H04B 1/10* (2013.01); *H03M 1/121* (2013.01); *G10L 15/02* (2013.01); *G10L 25/24* (2013.01); *H03M 1/1245* (2013.01); *H04R 3/04* (2013.01); *H04W 84/18* (2013.01)

(58) Field of Classification Search
CPC ........ H04B 1/10; G10L 25/24; H03M 1/1245; H04R 3/04; H04W 84/18
See application file for complete search history.

(56) References Cited

U.S. PATENT DOCUMENTS

2005/0156775 A1* 7/2005 Petre ..................... H03M 1/121
                                                                 341/155

OTHER PUBLICATIONS

Lowenborg, Per & Johansson, Håkan & Wanhammar, Lars, A Survey of Filter Bank A/D Converters, Department of Electrical Engineering, Linkoping University, (2019). (Year: 2019).*

* cited by examiner

*Primary Examiner* — Michelle M Koeth
(74) *Attorney, Agent, or Firm* — Maginot, Moore & Beck LLP

(57) ABSTRACT

A method for processing a signal includes reading in a signal and filtering the signal using a first number of band-pass filters in order to obtain one band-pass filtered signal per band-pass filter. The first number of band-pass filters is configured to each allow distinct frequency ranges of the signal to pass. The method further includes calculating at least one signal parameter each from the plurality of band-pass filtered signals. The method further includes performing analog-to-digital conversion of the plurality of band-pass filtered signals or signals derived therefrom using a plurality of signal parameters such that a second number of analog-to-digital converters used to perform the analog-to-digital conversion is less than the first number of band-pass filters used to filter the signal.

15 Claims, 4 Drawing Sheets

METHOD AND DEVICE FOR PROCESSING A SIGNAL

This application claims priority under 35 U.S.C. § 119 to patent application no. DE 102017212431.8 filed on Jul. 20, 2017 in Germany, the disclosure of which is incorporated herein by reference in its entirety.

The disclosure is based on a device or a method of the type described herein. The subject matter of the present disclosure is also a computer program.

BACKGROUND

With the development of wireless sensor nodes and sensors in wearable textiles the demand for electronic components with low power consumption has been significantly increasing. For example, a development objective consists of achieving a power consumption in electronic components in the range below one micro-watt for many applications, for example for the always-on functionality in textiles and the intelligent signal processing for integrated sensors for use in Industry 4.0 scenarios.

The analysis of sensor signals requires the extraction of useful information or parameters, which can also be referred to as "features" of the signal. Although the sampling or digitization of the signal at the Nyquist rate or above ensures the (complete) reconstruction of the signal, important features can also be obtained from processing at a lower frequency or rate (i.e., sampling frequency or sampling rate) of the signal. For example, in most real-world applications the sampling rate for audio recorders at a frequency of 8000 Hz to 44,100 Hertz can be sufficient. In an intelligent implementation, however, the rate of the "digitization" can also take place at a sampling frequency which is reduced by an order of magnitude.

For example, a speech activity recognition system can be based on an analog filter bank, in which the signal is decomposed into different spectral components. The features used for the speech recognition are then, for example, the energies in each frequency band. The sampling frequency can be reduced to 640 hertz, which in an example recognition system investigated would lead to a maximum power consumption of 6 microwatt.

A feature vector obtained in this way, which obtains and/or represents the properties/energies in each frequency band or spectral range, is then passed to a classifier, which discriminates speech from other signals on the basis of a decision tree. A microcontroller is then used to select, on the basis of a current signal-to-noise ratio and noise type, which features are useful for further analysis. This means that the signals from all channels/frequency ranges must be passed through a multiplexer, digitized using an analog-to-digital converter and then transferred to the classifier. However, not all features/energies are usually used for the classification for the entire time.

SUMMARY

Against this background, in the approach presented here a method and a device which uses this method, and finally, a corresponding computer program are disclosed. These measures enable advantageous extensions and improvements to the device.

The approach presented here creates a method for processing a signal, wherein the method has the following steps:
reading in a signal,
filtering the signal using a plurality of band-pass filters, in order to obtain one band-pass filtered signal per band-pass filter, wherein the different band-pass filters allow distinct frequency ranges of the signal to pass;
calculating at least one signal parameter each from at least a plurality of band-pass filtered signals; and
analog-to-digital conversion of a plurality of band-pass filtered signals, or signals derived therefrom, using the signal parameters, wherein in the analog-to-digital conversion step a number of analog-to-digital converters is used which is less than a number of band-pass filters used in the filtering step.

A signal can be understood to mean an audio signal/speech signal. A band-pass filter can be understood to mean a filter which is designed to allow a pre-defined spectral component or pre-defined frequency range of the signal to pass and/or to attenuate or suppress signal components outside this spectral component or pre-defined frequency range. A signal parameter can be understood to mean a value which represents a feature or a plurality of features of the band-pass filtered signal, for example an amplitude, a phase, an energy and/or a power.

The approach proposed here is based on the recognition that for the advantageous processing of the signal, a small number of analog-to-digital converter units, for example, separate analog-to-digital converters or corresponding channels of analog-to-digital converters, are required to filter the signal as a band-pass filter. In this approach the band-pass filters, for example in the manner of a filter bank, can provide a parallel filtering of the signal for calculating different spectral components of the signal, wherein, typically utilizing knowledge of the signal parameter, an inference as to the properties of the individual band-pass filtered signals is then possible and certain band-pass filtered signals which lack relevance to the contents of these band-pass filtered signals do not need to be analog-to-digitally converted.

As a result, the approach proposed here offers the advantage of enabling the circuitry or computational effort required in the processing of the signal to be reduced, since the analog-to-digital conversion of part of the band-pass filtered signals can be avoided in the absence of relevant signal content. The term 'relevant signal content' here can be understood to mean an information content in the band-pass filtered signal which is greater than an information content in another band-pass filtered signal. In this way, it is possible to carry out a preliminary analysis of the band-pass filtered signals before any further complex processing is performed, either computationally and/or in terms of circuitry. Thus, on the one hand, in the case of a circuit-based implementation, chip area can be saved and on the other hand, in the operation of a corresponding device that implements the approach proposed here, electrical power can be saved, since only a smaller proportion of analog-to-digital converter units needs to be operated.

With an advantageous embodiment of the approach proposed here, signal parameters can be calculated in the calculation step which each represent an energy and/or power of a band-pass filtered signal. Such an embodiment of the proposed approach offers the advantage of providing highly meaningful information by means of the signal parameter, which enables an easily implemented inference as to the relevance or the information contained in the band-pass filtered signal.

A further advantageous embodiment of the approach proposed here is one in which the particular band-pass filtered signals that are analog-to-digitally converted in the analog-to-digital conversion step are those which have a signal parameter that corresponds to a pre-defined criterion, in particular that is greater than at least one other signal parameter of a band-pass-filtered signal and/or is greater than a threshold value. Such an embodiment offers the advantage of a means, which is very simple to implement either in circuit technology and/or computationally, for analog-to-digitally converting specifically those band-pass-filtered signals which are expected to have a high degree of relevance, hence a high information content from the original signal.

Also advantageous is an embodiment of the approach proposed here, in which the band-pass-filtered signals that are analog-to-digitally converted in the analog-to-digital conversion step are those which have the largest signal parameters. Such an embodiment offers the advantage of a particularly efficient processing of the signal, since the spectral signal components which are analog-to-digitally converted are specifically those that will allow a maximum information content to be inferred from the band-pass filtered signals obtained in the filtering step.

Also of advantage is an embodiment of the approach proposed here, in which a set of band-pass filters that is designed to calculate the Mel-frequency cepstral coefficients of the signal is used in the filtering step. In the field of psycho-acoustic speech recognition the use of such a set of band-pass filters is particularly advantageous for detecting the frequency differences of speech components in the signal perceptible by human beings with the highest possible resolution by selecting a favorable number, and/or the center frequencies or band intervals of these band pass filters, but without unnecessary redundancy or without extracting differences in the speech signal that are not perceptible by humans.

In an embodiment of the approach proposed here which can be implemented in a technically very simple and efficient way, in the filtering step gm-C filters and/or C4-SOS filters are used as the band-pass filters for filtering the signal. This type of band-pass filter offers particularly simple structures specifically for the recognition of speech signals or the detection of speech in an audio signal.

According to a further embodiment of the approach proposed here, in the calculation step a rectification and/or a low-pass filtering of at least one of the band-pass filtered signals can be performed. Such an embodiment offers the advantage of a means for calculating the relevant signal parameters of the band-pass filtered signals which is technically simple to implement.

Another conceivable embodiment of the approach proposed here is one in which the steps of reading in, filtering, calculation and/or analog-to-digital conversion are executed repeatedly at pre-defined intervals of a pre-defined time grid. For example, such pre-defined time intervals can be no longer than 50 milliseconds, for example 32 milliseconds. Such an embodiment of the approach proposed here has the advantage of enabling an analysis of the signal to be performed within the range of humanly perceptible discrete time intervals, and of being able to respond appropriately to a temporal change in the spectral components occurring in the signal by a change in the processing, in particular by a change in the analog-to-digital conversion of different spectral signal components of the signal.

A particularly advantageous embodiment of the approach proposed here is one in which in the repeatedly executed analog-to-digital conversion step, at least one band-pass filtered signal which has not been analog-to-digitally converted in a preceding step of the analog-to-digital conversion is analog-to-digitally converted. Such an embodiment of the proposed approach offers the advantage of a flexible substitution of the band-pass filtered signals to be converted by the limited number of available analog-to-digital converter units, so that the particular band-pass filtered signals which are currently expected to have the greatest relevance or the highest information content in the signal are also further processed by the analog-to-digital converter units.

In another embodiment of the approach proposed here which is technically very simple to implement, in the analog-to-digital conversion step an analog-to-digital converter unit is used with a plurality of converter channels, wherein each of the converter channels is used for the analog-to-digital conversion of one of the band-pass filtered signals. In this way, an efficient structure of the analog-to-digital converter unit can be used, wherein the individual channels or converter channels are used for the subsequent processing of each of the band-pass filtered signals selected (by using the signal parameters).

In order to ensure that as little information from the band-pass filtered signals is lost, according to a further embodiment of the proposed approach, in the filtering step each one of the analog-to-digital converter units can be operated with a sampling frequency which is at least equal to the Nyquist frequency of the band-pass filtered signal to be converted.

The alternative designs of the method presented here can be implemented, for example, in software or hardware or in a combination of software and hardware, for example, in a control unit.

The approach presented here also creates a device that is designed to carry out, to control and/or implement the steps of an alternative design of a method presented here in corresponding devices.

Also by means of this design variant of the disclosure in the form of a device, the underlying object of the disclosure can be achieved quickly and efficiently.

For this purpose, the device can comprise at least one computation unit for processing signals or data, at least one storage unit for storing signals or data, at least one interface to a sensor or an actuator for reading in sensor signals from the sensor or for outputting data or control signals to an actuator, and/or at least one communication interface for reading in or outputting data embedded in a communication protocol. The processing unit can be, for example, a signal processor, a micro-controller or the like, wherein the storage unit can be a flash memory, an EEPROM or a magnetic storage unit. The communication interface can be designed to read in or output data by wireless and/or cable-based means, wherein a communication interface which can read in or output cable-based data can read in this data, for example, by electrical or optical means from an appropriate data transmission line or can output this data into an appropriate data transmission line.

A device in the present case can be understood to mean an electrical device, which processes sensor signals and outputs control and/or data signals depending on them. The device can have an interface, which can be implemented in hardware and/or software. In the case of a hardware-based design, the interfaces can be, for example, part of a so-called system-ASIC, which includes the wide range of functions of the device. It is also possible, however, that the interfaces are dedicated integrated circuits, or at least in part consist of discrete components. In the case of a software-based design, the interfaces can be software modules which exist, for example, on a micro-controller in addition to other software modules.

In an advantageous design the device controls a speech recognition system or speech analysis system. For this purpose, the device can access, for example, sensor signals, such as speech signals, as the signals. The processing is carried out using processing units such as micro-controllers or signal processors.

Also advantageous is a computer program product or computer program with program code, which can be stored on a machine-readable medium or storage medium, such as a semiconductor memory, a hard drive or an optical storage device, and is used to carry out, implement and/or control the steps of the method according to any one of the embodiments described above, in particular when the program product or program is executed on a computer or a device.

BRIEF DESCRIPTION OF THE DRAWINGS

Exemplary embodiments of the approach presented here are shown in the drawings and explained in more detail in the following description. Shown are.

DETAILED DESCRIPTION

Figure 1:
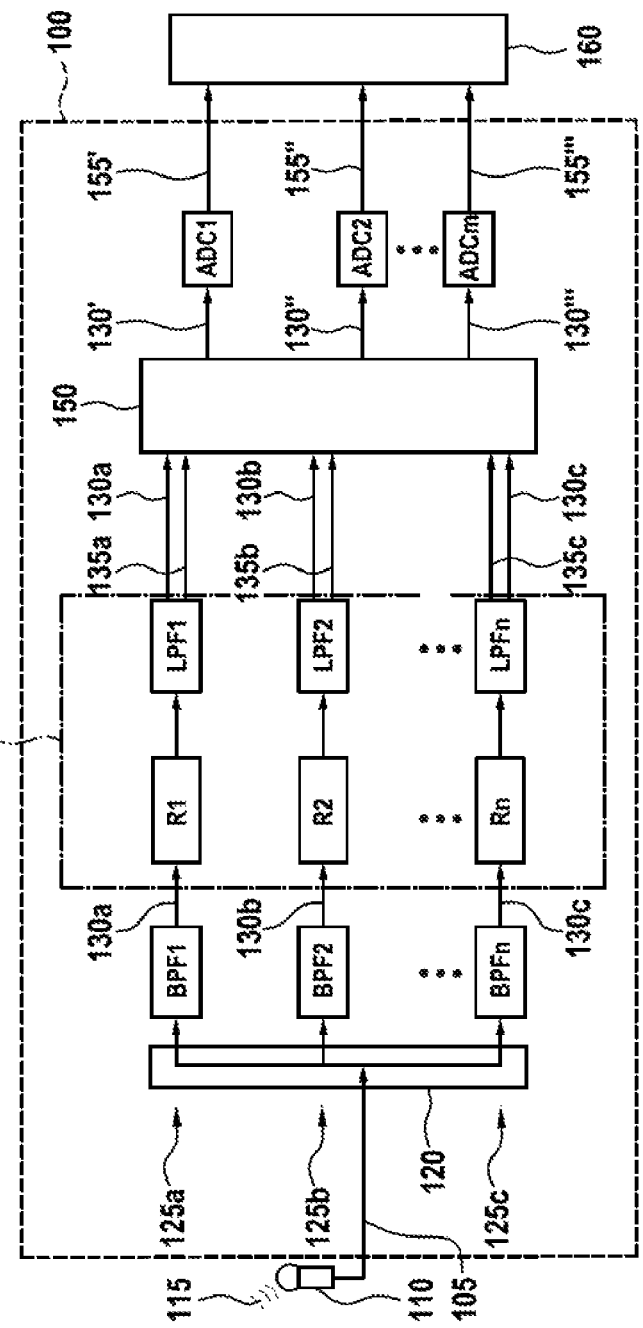
FIG. 1 a block circuit diagram of a device in accordance with an exemplary embodiment.

In the following description of advantageous exemplary embodiments of the present disclosure, identical or similar reference numerals are used for elements shown in the various figures which have similar functions, wherein no repeated description of these elements is given.

FIG. 1 shows a block circuit diagram of a device 100 for processing a signal 105 according to an exemplary embodiment of the present disclosure. The signal 105 can be output, for example, by a microphone 110 and can represent an acoustic speech signal 115, which was uttered by a person, for example. The signal 105 is read in by a reader interface 120 of the device 100 and is duplicated into a representation or copy of this signal 105 for output into each of a plurality of different processing branches 125a, 125b and 125c. In each of these processing branches 125a, 125b and 125c the signal 105 is filtered by a band-pass filter BPFx (where the variable x with a range of values from 1 to n denotes a specific, individual band-pass filter) of a plurality of band-pass Filters BPF, to obtain a corresponding band-pass filtered signal 130a (in the first processing branch 125a), 130b (in the second processing branch 125b) or 130c (in the n-th processing branch 125c). In this arrangement the band-pass filters BPFx in each of the separate processing branches 125a, 125b and 125c are designed in such a way that they allow different spectral components of the signal 105 to pass and other spectral components of the signal 105 are accordingly attenuated and/or suppressed in the separate processing branches 125a, 125b and 125c. As a result, the frequency components or frequency ranges occurring in the band-pass-filtered signals 130a, 130b and 130c differ from each other. Due to the plurality of band-pass filters BPF1, BPF2, BPFn in the form of a filter bank, the signal 105 can therefore be decomposed into sub-signals different from the band-pass-filtered signals 130a, 130b and 130c, each of which contain signal components from different frequency bands of the signal 105.

The band-pass filtered signals 130a, 130b and 130c are now fed to a calculation unit 140, which calculates one signal parameter 135a, 135b and 135c for each of the band-pass filtered signals 130a, 130b and 130c. The respective signal parameters 135a, 135b and 135c are calculated in such a way that they represent a feature or a piece of information which is contained in the relevant band-pass filtered signal 130a, 130b and 130c respectively. For example, this signal parameter 135a, 135b and 135c can represent an energy, a power and in general, the presence of oscillations or amplitude in the particular associated band-pass filtered signals 130a, 130b and 130c. For example, in the case where an energy is indicated in the relevant band-pass filtered signal 130, the signal parameter 135 can be obtained by initially performing a rectification of the relevant band-pass filtered signal 130 using a rectifier R, whereupon a low-pass filter LPF low-pass filters the now rectified band-pass filtered signal 130 to obtain the corresponding signal parameter 135. In this way, for example, the first signal parameter 135a can be obtained by rectifying the first band-pass filtered signal 135a using the first rectifier R1 and then low-pass filtering the resulting signal with the first low-pass filter LPF1. Likewise, for example the second signal parameter 135b can be obtained by rectifying the second band-pass filtered signal 135b using the second rectifier R2 and low-pass filtering the resulting signal with the second low-pass filter LPF2. Also, for example, the n-th signal parameter 135c can be obtained by rectifying the n-th to band-pass filtered signal 135c using the n-th rectifier Rn and low-pass filtering the resulting signal with the n-th low-pass filter LPFn.

Each of the band-pass filtered signals 130a, 130b to 130c now available, together with the associated signal parameters 135a, 135b and 135c, are then fed to a control unit 150, which evaluates the respective signal parameters 135a, 130b and 135c using a pre-defined criterion under a pre-defined processing rule. According to the evaluation of the signal parameters 130a, 135b to 135c, corresponding band-pass filtered signals 130 are then assigned to analog-to-digital converter units ADC1, ADC2 to ADCm, in which the corresponding band-pass filtered signals 130', 130" to 130' are analog-to-digitally converted in order to then obtain digitized band-pass filtered signals 155', 155" to 155' which can be further processed in a subsequent processing unit 160 in which, for example, an analysis of the acoustic speech signal 115 can be performed.

An important feature of the approach proposed here can be found in the fact that the number of band-pass filters BPF is greater than the number of analog-to-digital converter units ADC. Such a design of a circuit architecture offers the advantage of not needing to perform a time-consuming analog-to-digital conversion for all band-pass filtered signals 130, which on the one hand allows the necessary space requirements in an integrated circuit to be reduced and on the other hand, the power requirements for the operation of the device 100 to be lower than if each of the band-pass filtered signals 130 obtained had also been analog-to-digitally converted. The approach proposed here uses the fact that in most if not all cases, useful information is not present in every one of the bandpass-filtered signals 130, and it is often even the case that in some of these band-pass filtered signals 130 a complete absence of signals or signal amplitudes is found. As a result, it is usually possible to dispense with the analog-to-digital conversion of one or more band-pass filtered signals 130 without loss of information in the evaluation of the signal 105.

In order then, however, to feed those band-pass filtered signals 130a, 130b and 130c which carry the greatest information content from the signal 105 to the analog-to-digital converter units ADC1, ADC2 to ADCm, an evaluation of the respective signal parameters 135a, 135b and 135c is performed in the control unit 150. If, for example, the signal parameters 135 form an energy value which is contained in the associated band-pass filtered signal 130, it can be detected by the control unit 150 which of the band-pass filtered signals 130a, 130b and 130c contain the largest energy or the largest energy components, so that these band-pass filtered signals 130 with the highest components of energy probably also carry the largest proportions of useful information, so that these band-pass-filtered signals 130, for example, should also be analog-to-digitally converted by the available analog-to-digital converter units ADC. In this way, the first band-pass filtered signal 130a, for example, can be fed to the first analog-to-digital converter unit ADC1 as band-pass filtered signal 130', wherein the second band-pass filtered signal 130b, for example, is fed as a band-pass filtered signal 130" to the second analog-to-digital converter unit ADC2, etc.

The idea of the approach proposed here can therefore be viewed as a reduction of the sample rate at a particular point in time by cutting out or omitting all less important signal components or features/energies, before any multiplexing takes place.

The aim of the approach presented here can therefore be viewed as an implementation of a signal processing system which works on the basis of a feature extraction of signal components with a lower number of components than in the prior art, so that the space required for an implementation of this approach in an integrated circuit is reduced and the power consumption of this integrated circuit is lowered. An important aspect of the approach proposed here can be seen in the application of intelligent selection of filters with a small number of channels in the analog-to-digital converter. Advantageously this enables the number of analog-to-digital converter channels or units to be used for a signal processing task to be reduced, so that for the implementation of the approach proposed here, a smaller surface area of an integrated circuit is required and a lower power consumption can be achieved by a reduction of the sampling rate, which is frequently possible.

A block diagram of an implementation of the presented approach in accordance with the first exemplary embodiment has already been described in FIG. 1. FIG. 1 shows the structure of the proposed filter-based feature extraction. In this example, which is based on a conventional architecture, the signal 105 is passed through a certain number n of band-pass filters (BPF). The number of these (band-pass) filters, their bandwidths, frequency spacing and other factors depends, for example, on the target application, such as a speech analysis of human speech. For example, in a speech recognition system based on the approach presented here, the recommended number of (band-pass) filters can be between n=8 and n=24 and the (spectral) interval between the band-pass filters can be based on Mel frequencies (pitch-based). In the following, the energy within a frequency band is specified as a signal parameter and/or obtained by the application of a peak detector (for example in the form of a rectifier and low-pass filter).

In contrast to a conventional implementation, the analog-to-digital converter (or equivalent channels) required for the proposed architecture can have a lower number m of channels than the number n of (bandpass) filters (i.e., m<n). This is based on the idea that in many applications, the full use of all (band-pass) filters over the entire period under consideration is not necessary, rather a small number of sets of (band-pass) filters are used in one time window and at least one other set of (band-pass) filters is used in another time window.

Figure 2:
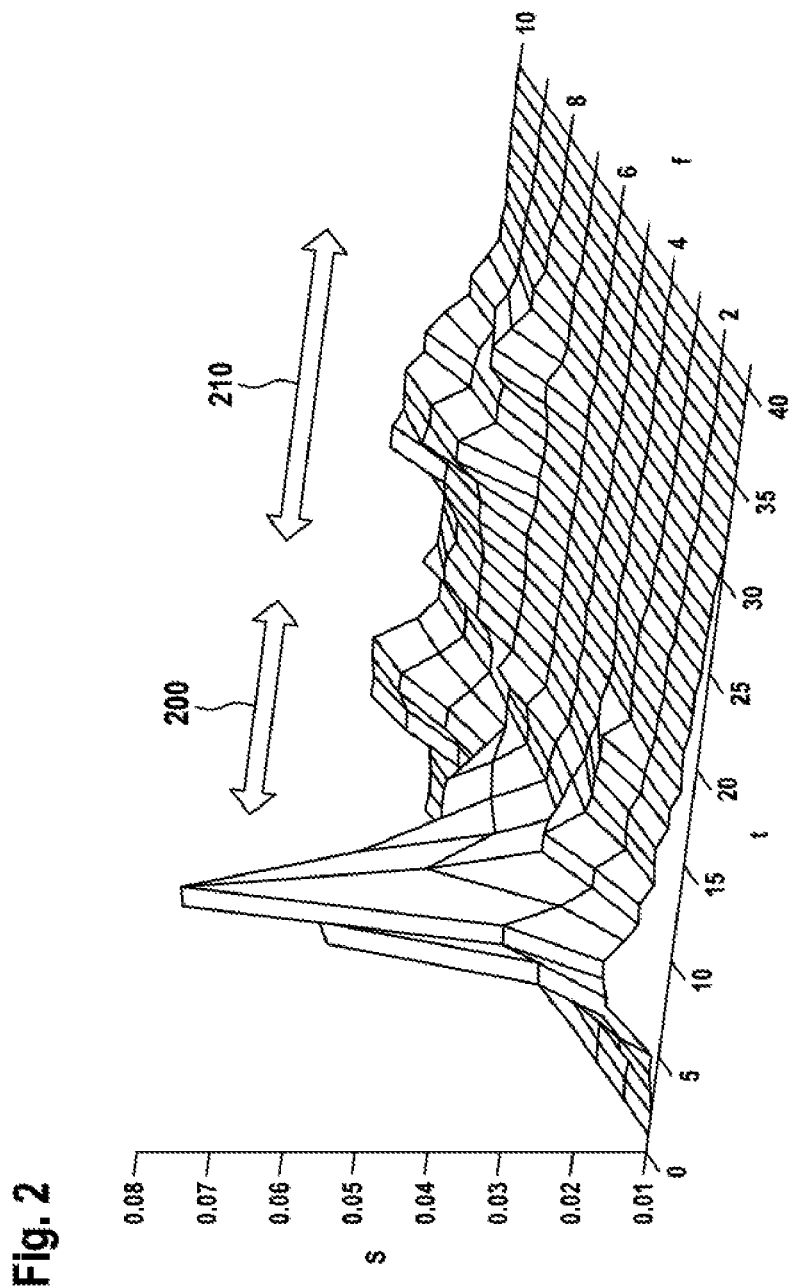
FIG. 2 a diagram to illustrate the occurrence of the speech component of a keyword in the frequency and time domain.

FIG. 2 shows a time-frequency domain plot as an example of the development of filter energies S (i.e., energies in frequency bands which are assigned to the respective (band-pass) filters) over time t and the frequency range f to be evaluated, if a keyword detection application is running (in this case, for example, for the detection of the keyword "Bosch"). In this graph the amplitude of the signal energy of the signal 105 is plotted on the Z axis of FIG. 2, the time t (in appropriate time windows) on the X axis and a frequency f occurring in the signal 105 on the Y axis, where the frequency is expressed in the form of a filter index (i.e., a filter number of a band-pass filter, relative to a (center) frequency of the band-pass filter which is increasing with index number). In the present example ten (band-pass) filters are used to determine the Mel-frequency cepstral coefficients (MFCCs). The index of the time windows or frames, which is plotted on the time axis t (X axis), corresponds to a time window of 32 milliseconds. As shown in FIG. 2, not all (band-pass) filters are needed over the entire duration of the signal 105, because in some frequency ranges of the signal 105 no significant signal energy occurs for some of the time windows. This is a result of the fact that the speech component of the word fragment "Bo" (section 200 in FIG. 2) has significant components in the low frequency range for a short time, whereas the other speech component of the word fragment "sch" (section 210 in FIG. 2) in the signal 105 has higher frequency components over a longer duration. For this reason, a time-dependent selection of (band-pass) filters can give rise to the same features/frequency-band energies as if the signal 105 had been analyzed with a full utilization of the filter bank BPF for all time segments.

The number of components of the system shown in FIG. 2 or the device 100 can be further reduced if corresponding rectifiers R1, Rn and low-pass filters LPF1, . . . , LPFn are moved after a control unit 150 shown in FIG. 1. This may require a more complex control unit 150, however, as the decision about the significance of the results of individual (band-pass) filters on the basis of the corresponding frequency energies as signal parameters 135 from these (band-pass) filters may be easier than an assessment of the signals 105 directly after the band-pass filters BPF.

Figure 3:
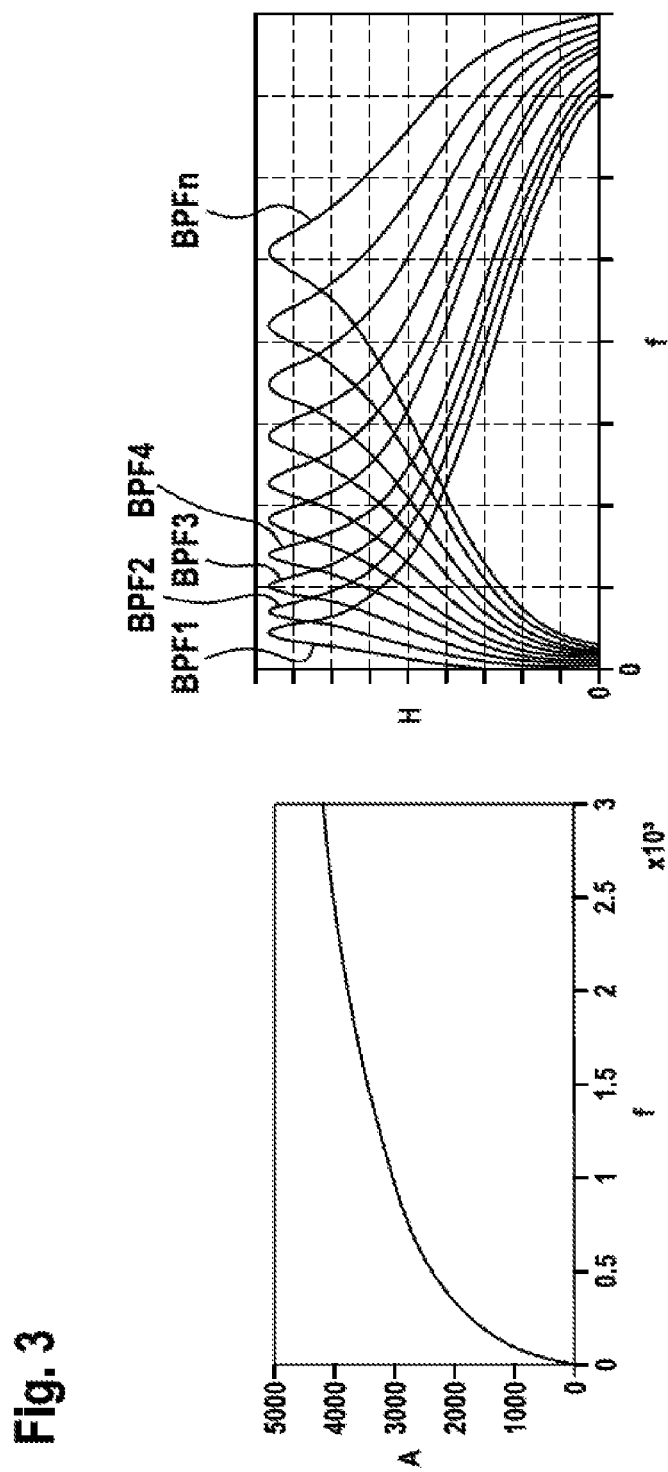
FIG. 3 two diagrams to illustrate the calculation of Mel-coefficients using filter banks.

Particular attention can be given to the advantageous design and/or implementation of the (band-pass) filters. Filter banks which use a Mel-frequency scale are based on the human perception of tones, which in terms of frequency is linear up to 1 kHz and logarithmic thereafter, as is shown in more detail in the left part of the diagram in FIG. 3, in which a pitch scaling A is plotted in Mel units on the ordinate of this graph and the frequency is plotted on the abscissa, wherein in the right-hand part of the diagram of FIG. 3 the frequency is plotted on the abscissa and the transfer functions H of the different band-pass filters BPF1, BPF2, BPF3, BPF4, BPFn are plotted on the ordinate.

The implementation of these (band-pass) filters BPF can be achieved with a low power-consuming analog gm-C filter or with C4-SOS filters, in which the cutoff frequencies could be electronically adjusted. A C4-SOS filter (=Capacitively-Coupled Current Conveyer with Autozeroing Second-order Section) in this context can be understood to mean a time-continuous band-pass filter with tunable time constants. The time constants are independently programmable. The programming is possible, for example, by means of floating-gate transistors in the form of current output sources, which enables the time constants to be adjusted individually. A higher-order filter may be composed of a plurality of C4 filters. A gm-C filter can be understood to mean a filter which is based on an operational transconductance amplifier (OTA), in which a current output is controlled by an input voltage (voltage-controlled current source, VCCS). The transconductance stage can consist, for example, of differentially wired MOS transistor pairs, the transconductance of which is controlled by the bias current. The transfer function of the filter is therefore tunable or adjustable, for example, by the transconductance.

One of the particular advantages of the proposed implementation of exemplary embodiments of the approach presented here is an application of an intelligent selection of filters with a reduced number of analog-to-digital converters or analog-to-digital converter channels (and/or rectifiers and band-pass filters), which results in a reduction of the chip surface area required for the implementation and/or in a reduction in power consumption during operation of a system designed in such a way. The size of the reduction of the power consumption and/or the required chip surface area depends on the intended application and the operating conditions (for example, a required signal-to-noise ratio).

The approach and/or the architecture proposed here is particularly well suited to the extraction of features in an always-on speech activity detection or to the recognition of voice commands (for example, for keyword detection) for textiles and smartphones, or for use in integrated sensor nodes for Industry 4.0 applications, in which low power consumption is very critical.

Figure 4:
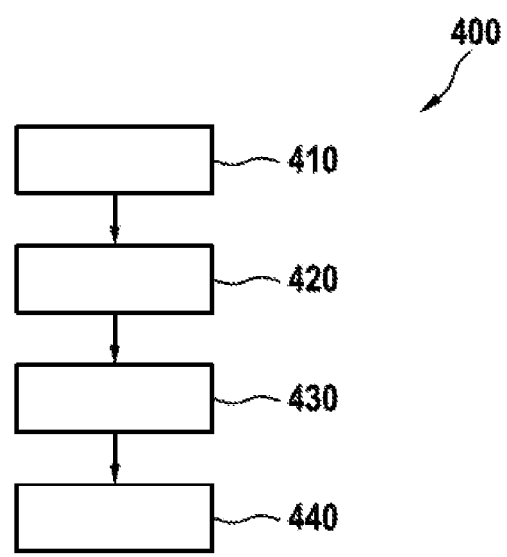
FIG. 4 a flow diagram of a method in accordance with an exemplary embodiment.

FIG. 4 shows a flow diagram of a method 400 for processing a signal. The method comprises a step 410 of reading in a signal and a step 420 of filtering the signal using a plurality of band-pass filters in order to obtain a band-pass filtered signal for each band-pass filter, wherein the band pass filters allow different frequency ranges of the signal to pass. The method 400 also comprises a step of calculating (420) at least one signal parameter (135a, 135b, 135c) each from at least a plurality of band-pass filtered signals, and a step 440 of the analog-to-digital conversion of a plurality of band-pass filtered signals or signals derived therefrom by using the signal parameters, wherein in the analog-to-digital conversion step a number of analog-to-digital converter units is used, which is less than a number of the band-pass filters used in the filtering step.

If an exemplary embodiment comprises an "and/or" association between a first and a second feature, this should be read as meaning that the exemplary embodiment according to one embodiment has both the first feature and the second feature and in accordance with another exemplary embodiment, it has either only the first or only the second feature.

What is claimed is:

1. A method for processing a signal, comprising:
   reading in the signal;
   filtering the signal using a first number of band-pass filters in order to obtain one band-pass filtered signal per band-pass filter, the first number of band-pass filters configured to each allow distinct frequency ranges of the signal to pass;
   calculating at least one signal parameter each from the plurality of band-pass filtered signals; and
   performing analog-to-digital conversion of the plurality of band-pass filtered signals or signals derived therefrom using the calculated at least one of signal parameters with a second number of analog-to-digital converters,
   wherein the second number of the analog-to-digital convertors is less than the first number of band-pass filters.

2. The method according to claim 1, wherein the at least one signal parameter calculated represents at least one of (i) an energy and (ii) a power of a band-pass filtered signal of the plurality of band-pass filtered signals.

3. The method according to claim 1, further comprising:
   performing the analog-to-digital conversion of the plurality of band-pass filtered signals that have a signal parameter corresponding to a pre-defined criterion.

4. The method according to claim 3, further comprising:
   performing the analog-to-digital conversion of the plurality of band-pass filtered signals that have the largest signal parameters.

5. The method according to claim 1, further comprising:
   filtering the signal using the first number of band-pass filters that are configured to determine Mel-frequency cepstral coefficients of the signal.

6. The method according to claim 1, further comprising:
   filtering the signal using the first number of band-pass filters that are at least one of (i) gm-C filters and (ii) capacitively-coupled current conveyer with autozeroing second-order section filters.

7. The method according to claim 1, further comprising:
   calculating the at least one signal parameter each from the plurality of band-pass filtered signals by performing at least one of (i) a rectification and (ii) a low-pass filtering of at least one of the plurality of band-pass filtered signals.

8. The method according to claim 1, wherein at least one of (i) reading in the signal, (ii) filtering the signal, (iii) calculating the at least one signal parameter, and (iv) performing the analog-to-digital conversion are executed repeatedly at pre-defined intervals of a pre-defined time grid.

9. The method according to claim 8, further comprising:
   performing analog-to-digital conversion of at least one of the plurality of band-pass filtered signals that has not been analog-to-digitally converted.

10. The method according to claim 1, further comprising:
    performing the analog-to-digital conversion using an analog-to-digital converter unit with a plurality of converter channels, each of the plurality of converter channels configured to be used for the analog-to-digital conversion of one of the plurality of band-pass filtered signals.

11. The method according to claim 10, further comprising:
    operating each of the analog-to-digital converter units with a sampling rate at least equal to a Nyquist frequency of the bandpass-filtered signal to be converted.

12. A device comprising:
    a reading interface;
    a calculating unit; and
    a plurality of analog-to-digital converter units,
    wherein the device is configured to:
    read in a signal using the reading interface;
    filter the signal using a first number of band-pass filters in order to obtain one band-pass filtered signal per band-pass filter, the first number of band-pass filters configured to each allow distinct frequency ranges of the signal to pass;
    calculate, using the calculating unit, at least one signal parameter each from the plurality of band-pass filtered signals; and
    perform, using the plurality of analog-to-digital converter units, analog-to-digital conversion of the plurality of band-pass filtered signals or signals derived therefrom using the at least one signal parameter with a second number of analog-to-digital converters, wherein the second number of the analog-to-digital convertors is less than the first number of band-pass filters.

13. The method according to claim 1, wherein a computer program is configured to at least one of execute and control the method.

14. The method according to claim 13, wherein the computer program is stored on a machine-readable storage medium.

15. The method according to claim 3, further comprising:

performing the analog-to-digital conversion of the plurality of band-pass filtered signals that have a signal parameter that is at least one of (i) greater than at least one other signal parameter of one other of the plurality of band-pass-filtered signals and (ii) greater than a threshold value.

* * * * *